(12) United States Patent
Liu

(10) Patent No.: US 6,391,763 B1
(45) Date of Patent: May 21, 2002

(54) METHOD FOR FORMING A PLUG OR DAMASCENE TRENCH ON A SEMICONDUCTOR DEVICE

(75) Inventor: Hao-Chieh Liu, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/592,146

(22) Filed: Jun. 12, 2000

(30) Foreign Application Priority Data

Dec. 17, 1999 (TW) .......................................... 88122287 A

(51) Int. Cl.[7] .......................................... H01L 21/4763

(52) U.S. Cl. ....................................................... 438/622

(58) Field of Search ................................. 438/584, 622, 438/675, 677, 689, 709, 712, 715, 717, 725, 758, 773, 782

(56) References Cited

U.S. PATENT DOCUMENTS 6,165,695 A * 12/2000 Yang et al. .................. 430/314

* cited by examiner

Primary Examiner—Michael J. Sherry
Assistant Examiner—Lisa Kilday
(74) Attorney, Agent, or Firm—Alston & Bird LLP

(57) ABSTRACT

A method for forming a plug or damascene trench on a semiconductor device includes the following steps: depositing a dielectric layer consisting of hydrogen silsesquioxane (HSQ) on the semiconductor device, depositing a mask layer consisting of a hard mask material on the dielectric layer, removing a portion of the mask layer and defining the remaining portion of the mask layer as a hard mask, curing the portion of the dielectric layer not covered with the hard mask by e-beam; removing the portion of the dielectric layer not being cured by e-beam with a wet etch process to create an opening in the dielectric layer, wherein the wet etch rate of the portion of the dielectric layer being e-beam cured is significantly lower than that of the portion of the dielectric layer not being e-beam cured, and filling the opening in the dielectric layer with a kind of metal material or polysilicon.

22 Claims, 4 Drawing Sheets

METHOD FOR FORMING A PLUG OR DAMASCENE TRENCH ON A SEMICONDUCTOR DEVICE

FIELD OF THE INVENTION

The present invention relates to a method for forming a plug or damascene trench. In particular, it relates to a method for forming a plug or damascene trench on a semiconductor device with a wet etch process.

BACKGROUND OF THE INVENTION

In the semiconductor manufacturing industry, the etch process plays an important role in the fabricating process of a semiconductor device. The etch process is to remove a portion of the deposited thin film according to the pattern transferred from a photomask by chemical reactions or physical actions. Therefore, the desired semiconductor device will be successfully fabricated. At the present time, there are two etch techniques employed in the semiconductor fabricating process: one is wet etch, which etches the deposited thin film by chemical reactions; and the other is dry etch, which etches the deposited thin film by physical actions.

Comparing the wet etch process with the plasma reactive ion etch (plasma RIE) process, which is a dry etch process combining the properties of the sputtering etch process and the plasma etch process, the wet etch process has the following advantages:

1. The underlayer of the semiconductor device will be damaged if plasma RIE is employed, whereas employing the wet etch process will not damage the underlayer of the semiconductor device.
2. The selectivity of the wet etch process is significantly higher than that of the plasma RIE process.
3. The top corner rounding effect will automatically emerged if the wet etch process is employed so that the subsequent metal filing process can be carried out more easily.

Unfortunately, because the wet etch process is an isotropic etch process, the critical dimension (CD) will be difficult to control when the wet etch process is employed to form a via/contact or is employed to damascene trench technique. That will severely affect the progress of the subsequent fabrication processes and lower the yield of the semiconductor devices fabricated thereby.

There arises a need to develop a method for forming a plug or damascene trench on a semiconductor device with a wet etch process such that the metal filling process can be carried out more easily, and the plug or damascene trench formed thereby has a better CD control ability.

SUMMARY OF THE INVENTION

It is therefore an object of the present invention to provide a method for forming a plug or damascene trench on a semiconductor device with a wet etch process such that the plug or damascene trench has a better CD control ability.

The method for forming a semiconductor structure on a semiconductor device according to the present invention includes the following steps: depositing a dielectric layer on the semiconductor device, depositing a mask layer on the dielectric layer, removing a portion of the mask layer and defining the remaining portion of the mask layer as a hard mask, processing the portion of the dielectric layer not covered with the hard mask, removing the portion of the dielectric layer covered with the hard mask with a wet etch process, in which the wet etch rate of the portion of the dielectric layer not covered with the hark mask is significantly lower than that of the portion of the dielectric layer covered with the hard mask to create an opening in the dielectric layer, and filling the opening in the dielectric layer with a conducting material.

In accordance with the present invention, the dielectric layer is a spin-on-glass (SOG) material, and more preferably, a hydrogen silsesquioxane (HSQ) with a thickness of about 2000 to 20000 Å.

In accordance with the present invention, wherein before the mask layer is deposited, the dielectric layer is further processed by a thermal cure process at an ambient temperature of about 300–500° C.

Certainly, the mask layer is made of a hard mask material with a thickness of about 10–1000 nm.

Alternatively, the hard mask material is one selected from a group consisting of polysilicon, oxide, silicon nitride, silicon-oxy-nitride, titanium nitride, titanium-oxy-nitride, aluminum oxide, or silicon carbide.

In accordance with the present invention, the step of removing a portion of the mask layer and defining the remaining portion of the mask layer as a hard mask further includes the steps of: forming a patterned photoresist layer onto a portion of the mask layer, removing a portion of the mask layer according to the pattern on the patterned photoresist layer, and removing the photoresist layer.

In accordance with the present invention, the step of removing a portion of the mask layer according to the pattern on the patterned photoresist layer is executed by a plasma etch process.

In accordance with the present invention, the step of processing the portion of the dielectric layer not covered with the hard mask is executed by an electron-beam cure process.

Preferably, the electron-beam cure process is processed with a substrate temperature of about 300–500° C., a dosage of about 1000–10000 $\mu$ c/cm$^2$, and an energy of about 1–20 Kev.

In accordance with the present invention, the hard mask is removed by a chemical mechanical polishing (CMP) process or a plasma reactive ion etch (plasma RIE) process.

Preferably, the etching agent of the wet etch process is a diluted hydrofluoric acid (HF) solution or a buffered hydrofluoric acid (BHF)solution.

Noticeably, the wet etch rate of the portion of the dielectric layer being cured by electron-beam is significantly lower than that of the portion of the dielectric layer not being cured by electron-beam.

Preferably, the conducting material is a kind of metal material or a ploysilicon.

In accordance with the present invention, the semiconductor structure formed thereby is a plug or damascene trench.

Now the foregoing and other features and advantages of the present invention will be more clearly understood through the following descriptions with reference to the accompanying drawings, in which:

DETAILED DESCRIPTION OF THE PREFERRED EMBODIMENTS

The following embodiment selects the hydrogen silsesquioxane as the dielectric material to form a plug or damascene trench on a semiconductor device. Hydrogen silsesquioxane (HSQ) is an inorganic spin-on-glass (SOG) material, and it has been successfully employed in the fabrication process of pre-metal dielectric layer (PMD) and intermetal dielectric (IMD). The HSQ has some advantages, for example, it can achieve self planarization without employing the etch back process, and can be converted into silicon oxide ($SiO_2$) with proper annealing. Additionally, the HSQ can be cured and densified with e-beam with low thermal budget at below 400° C. The experimental statistics reveals that the wet etch rate of the e-beam cured HSQ will be significantly lower than that of the thermally-cured HSQ. The present invention takes advantage of the isotropic nature of wet etch process together with the significant wet etch rate difference between e-beam cured HSQ and thermally-cured HSQ to form plugs or damascene trenches. Thus the formation process of plugs or damascene trenches will be simplified and the plugs or damascene trenches will have a better CD control ability.

Figure 1A:
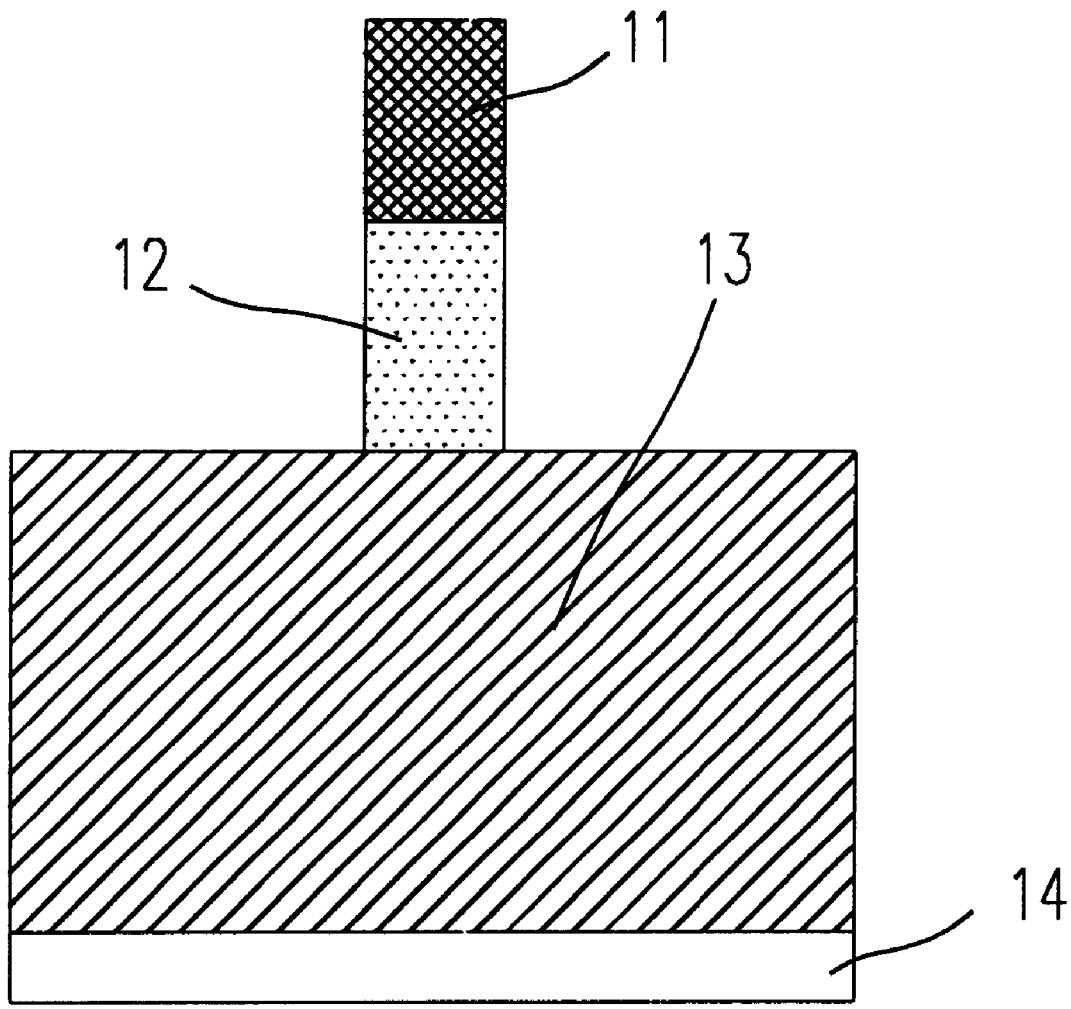
FIGS. 1A–D depicts the method for forming a plug or damascene trench on a semiconductor device according to the present invention.

The formation process for forming a plug is described in detail as follows. Referring to FIG. 1A, a film of HSQ material 13 with a thickness ranged from 2000 to 20000 Å is deposited onto the semiconductor device 14 by a spin coating process. The surface planarization of the HSQ film 13 will be achieved automatically due to the flow capability of HSQ. Thereafter, the HSQ film 13 is thermally cured at an ambient temperature of about 300 to 500° C. in order to expel the residual moisture and solvent from the HSQ film 13. A mask layer consisting of a hard mask material with a thickness of about 10 to 1000 nm is then deposited onto the HSQ film 13. The hard mask material can be, but not limited to, a polysilicon, an oxide, a silicon nitride ($Si_3N_4$), a silicon-oxy-nitride (SiON), a titanium nitride (TiN), a titanium-oxy-nitride (TiON), an aluminum oxide ($Al_2O_3$), or a silicon carbide (SiC).

Subsequently, a patterned photoresist layer 11 is formed on a portion of the mask layer. The photoresist layer bears the pattern for forming desired semiconductor feature, for example, a plug or damascene trench. A plasma etch process is then employed to etch the mask layer according to the pattern on the photoresist layer and a hard mask 12 is defined thereby.

Figure 1B:
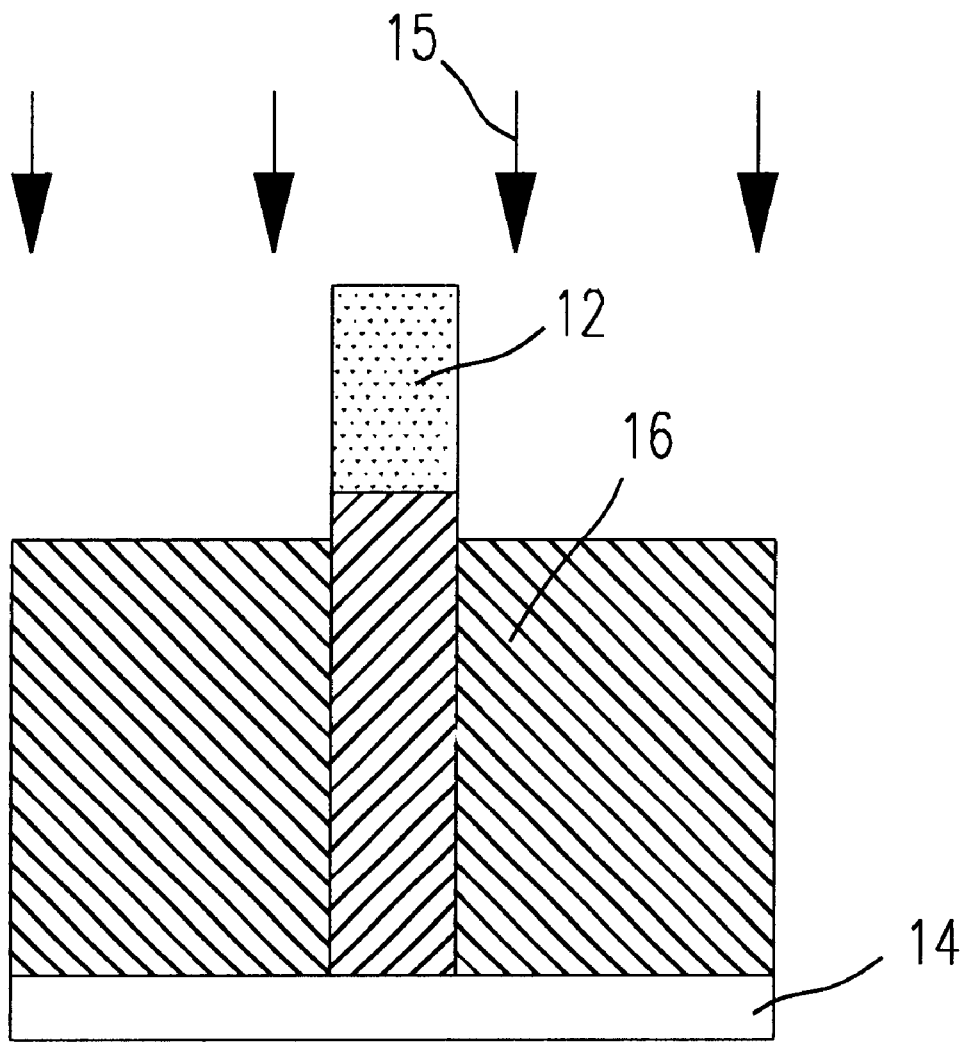

Please refer to FIG. 1B, after the plasma etch process is finished, the residual photoresist layer 11 of FIG. 1A is then removed. An e-beam cure process is further employed to cure the portion 16 of HSQ film not covered with the hard mask 12 by e-beam 15 so as to transform the HSQ film into a more dense and rigid structure. In e-beam cure process, the substrate temperature (300–500° C.), the dosage (1000–10000 $\mu c/cm^2$) and energy (1–20 Kev) of the e-beam 15 can be adjusted depending on the thickness of the HSQ film.

Figure 1C:
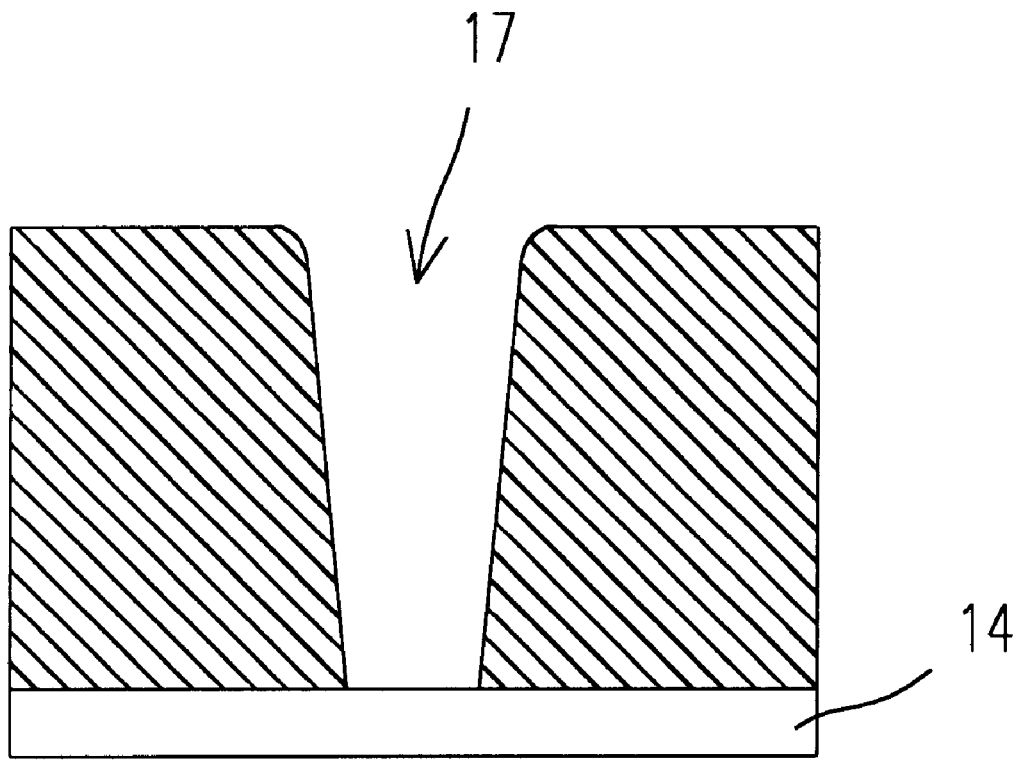

Hereafter, the hard mask 12 is removed by a chemical mechanical polishing (CMP) process or a plasma RIE process. A diluted hydrofluoric acid (HF) solution or a buffered hydrofluoric acid (BHF) solution is selected as the etching agent for performing the wet etch process to the HSQ film not being cured by e-beam 15. Due to the significant wet etch rate difference between the thermally cured HSQ film and the e-beam cured HSQ film and the isotropic nature of wet etch, an opening 17 in the HSQ film with a tapered profile and rounded top corner is formed as shown in FIG. 1C. Thus an improved CD control ability can be achieved at the end of wet etch process.

Figure 1D:
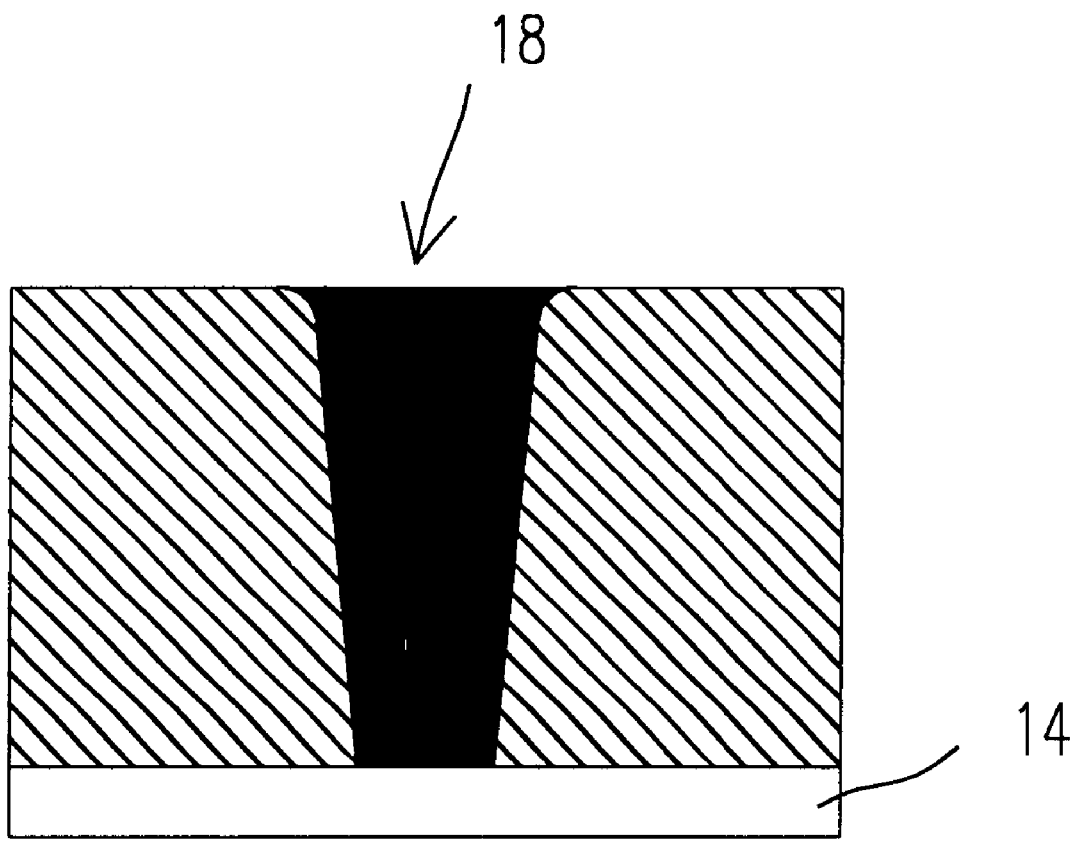

Please refer to FIG. 1D. Finally, a conducting material 18, for example, a kind of metal material or polysilicon, is filled in the opening 17 to form a via/contact plug. A CMP process or an etch back process can be employed subsequently for forming metal interconnections. It is worthy to note that the metal filling capability is greatly improved due to the tapered profile of the formed via/contact and its rounded top corner. Moreover, the damage caused by plasma RIE process can be avoided.

Concerning another aspect of the present invention, the steps for forming a damascene trench on a semiconductor device is similar to the aforementioned steps except the pattern on the patterned photoresist layer is replaced with a metal line pattern.

Broadly speaking, the dielectric material is not limited to the HSQ. As long as the material with the property of significant wet etch rate difference between being cured by e-beam and being cured thermally, it can be employed as the dielectric material in the present invention.

In conclusion, the present invention takes advantage of the isotropic nature of wet etch process together with the significant wet etch rate difference between e-beam cured HSQ and thermally cured HSQ to form a via/contact plug or damascene trench on a semiconductor device such that the CD control ability and the metal filling ability is greatly improved.

Those of skill in the art will recognize that these and other modifications can be made within the spirit and scope of the invention as defined in the appended claims.

What I claim is:

1. A method for forming a semiconductor structure on a semiconductor device comprising steps of:
    (a) depositing a dielectric layer on said semiconductor device;
    (b) depositing a mask layer on said dielectric layer;
    (c) removing a portion of said mask layer and defining the remaining portion of said mask layer as a hard mask;
    (d) processing the portion of said dielectric layer not covered with said hard mask with an electron-beam cure process;
    (e) removing said hard mask;
    (f) removing the portion of said dielectric layer cover with said hard mask with a wet etch process, in which the wet etch rate of said portion of said dielectric layer not covered with said hard mask is significantly lower than that of said portion of said dielectric layer covered with said hard mask to create an opening in said dielectric layer; and (g) filling said opening in said dielectric layer with a conducting material.

2. A method according to claim 1 wherein said dielectric layer is a spin-on-glass (SOG) material.

3. A method according to claim 2 wherein said spin-on-glass material is a hydrogen silsesquioxane (HSQ).

4. A method according to claim 3 wherein said dielectric layer has a thickness of about 2000 to 20000 Å.

5. A method according to claim 1 wherein before said step (b), said dielectric layer is further processed by a thermal cure process.

6. A method according to claim 5 wherein said thermal cure process is proceeded at an ambient temperature of about 300–500° C.

7. A method according to claim 1 wherein said mask layer is made of a hard mask material.

8. A method according to claim 1 wherein said mask layer has a thickness of about 10–1000 nm.

9. A method according to claim 7 wherein said hard mask material is one selected from a group consisting of polysilicon, oxide, silicon nitride, silicon-oxy-nitride, titanium nitride, titanium-oxy-nitride, aluminum oxide, or silicon carbide.

10. A method according to claim 1 wherein said step (c) includes the steps of:
   (c1) forming a patterned photoresist layer onto a portion of said mask layer;
   (c2) removing a portion of said mask layer according to the pattern on said patterned photoresist layer; and
   (c3) removing said photoresist layer.

11. A method according to claim 10 wherein said step (c2) is executed by a plasma etch process.

12. A method according to claim 1 wherein said electron-beam cure process is processed with a substrate temperature of about 300–500° C.

13. A method according to claim 1 wherein said electron-beam cure process is processed with a dosage of about 1000–10000 $\mu c/cm^2$.

14. A method according to claim 1 wherein said electron-beam cure process is processed with an energy of about 1–20 Kev.

15. A method according to claim 1 wherein at said step (e), said hard mask is removed by a chemical mechanical polishing process.

16. A method according to claim 1 wherein at said step (e), said hard mask is removed by a plasma reactive ion etch process.

17. A method according to claim 1 wherein at said step (f), the etching agent of said wet etch process is a diluted hydrofluoric acid (HF) solution.

18. A method according to claim 1 wherein at said step (f), the etch agent of said wet etch process is a buffered hydrofluoric acid (BHF) solution.

19. A method according to claim 1 wherein said conducting material is a kind of metal material.

20. A method according to claim 1 wherein said conducting material is a ploysilicon.

21. A method according to claim 1 wherein said semiconductor structure is a plug.

22. A method according to claim 1 wherein said semiconductor structure is a damascene trench.

* * * * *